US009281305B1

(12) United States Patent
Yang et al.

(10) Patent No.: US 9,281,305 B1
(45) Date of Patent: Mar. 8, 2016

(54) TRANSISTOR DEVICE STRUCTURE

(71) Applicant: National Applied Research Laboratories, Taipei (TW)

(72) Inventors: Chih-Chao Yang, Hsinchu (TW);
Jia-Min Shieh, Hsinchu (TW);
Wen-Hsien Huang, Hsinchu (TW);
Tung-Ying Hsieh, Hsinchu (TW);
Chang-Hong Shen, Hsinchu (TW);
Szu-Hung Chen, Hsinchu (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 0 days.

(21) Appl. No.: 14/561,377

(22) Filed: Dec. 5, 2014

(51) Int. Cl.
*H01L 27/06* (2006.01)
*H01L 27/12* (2006.01)
*H01L 29/16* (2006.01)
*H01L 29/04* (2006.01)
*H01L 29/08* (2006.01)
*H01L 29/24* (2006.01)
*H01L 29/786* (2006.01)
*H01L 29/417* (2006.01)
*H01L 21/8238* (2006.01)

(52) U.S. Cl.
CPC .... *H01L 27/0688* (2013.01); *H01L 21/823814* (2013.01); *H01L 27/1203* (2013.01); *H01L 29/04* (2013.01); *H01L 29/0847* (2013.01); *H01L 29/1606* (2013.01); *H01L 29/24* (2013.01); *H01L 29/41783* (2013.01); *H01L 29/78648* (2013.01); *H01L 29/78684* (2013.01); *H01L 29/78696* (2013.01)

(58) Field of Classification Search
CPC ............ H01L 27/0688; H01L 29/41783; H01L 21/823814
See application file for complete search history.

(56) References Cited

U.S. PATENT DOCUMENTS

| 4,498,226 | A | * | 2/1985 | Inoue | H01L 21/2026 257/64 |
| 4,692,994 | A | * | 9/1987 | Moniwa | H01L 21/76248 148/DIG. 150 |
| 5,006,913 | A | * | 4/1991 | Sugahara | H01L 27/0688 257/67 |
| 5,162,892 | A | * | 11/1992 | Hayashi | H01L 21/3003 257/65 |
| 5,189,500 | A | * | 2/1993 | Kusunoki | H01L 27/0688 257/72 |
| 5,492,851 | A | * | 2/1996 | Ryou | H01L 27/10808 257/E27.026 |
| 5,612,552 | A | * | 3/1997 | Owens | H01L 27/0688 257/202 |

(Continued)

OTHER PUBLICATIONS

Wang et al., "Strained Silicon-Germanium-On-Insulator n-MOSFET With Embedded Silicon Source-and-Drain Stressors", IEEE Electron Device Letters, vol. 29, No. 1, Jan. 2008.
Shen et al., "Monolithic 3D chip integrated with 500ns NVM, 3ps logic circuits and SRAM", IEDM, Dec. 2013.
Yang et al., "Record-high 121/62 µA/µm on-currents 3D stacked epi-like Si FETs with and without metal back gate", IEDM, Dec. 2013.

(Continued)

*Primary Examiner* — Michele Fan
(74) *Attorney, Agent, or Firm* — WPAT, PC; Justin King

(57) ABSTRACT

A transistor device structure includes a substrate, a first transistor layer and a second transistor layer. The second transistor layer is disposed between the substrate and the first transistor layer. The first transistor layer includes an insulating structure and a first transistor unit. The insulating structure is disposed on the second transistor layer and has a protruding portion. The first transistor unit includes a gate structure, a source/drain structure, an embedded source/drain structure and a channel. The source/drain structure is disposed beside the gate structure and over the insulating structure. The embedded source/drain structure is disposed underneath the source/drain structure and in the insulating structure. The channel is defined between the protruding portion and the gate structure.

18 Claims, 12 Drawing Sheets

(56) References Cited

U.S. PATENT DOCUMENTS

| | | | | |
|---|---|---|---|---|
| 5,818,069 A * | 10/1998 | Kadosh | H01L 27/0688 | 257/368 |
| 5,863,818 A * | 1/1999 | Kadosh | H01L 27/0688 | 257/E21.614 |
| 5,898,189 A * | 4/1999 | Gardner | H01L 21/8221 | 257/350 |
| 5,949,092 A * | 9/1999 | Kadosh | H01L 21/8221 | 257/241 |
| 5,950,082 A * | 9/1999 | Gardner | H01L 21/8234 | 257/E21.616 |
| 6,191,442 B1 * | 2/2001 | Matsufusa | H01L 27/0688 | 257/301 |
| 6,259,133 B1 * | 7/2001 | Gardner | H01L 27/0688 | 257/315 |
| 6,380,010 B2 | 4/2002 | Brigham et al. | | |
| 6,420,730 B1 * | 7/2002 | Gardner | H01L 21/8221 | 257/67 |
| 6,924,517 B2 | 8/2005 | Chen et al. | | |
| 7,306,997 B2 | 12/2007 | Xiang et al. | | |
| 7,399,663 B2 | 7/2008 | Hoentschel et al. | | |
| 7,670,927 B2 * | 3/2010 | Bernstein | H01L 23/481 | 257/E25.027 |
| 8,008,137 B2 * | 8/2011 | Wu | H01L 21/8221 | 257/204 |
| 8,586,463 B2 * | 11/2013 | Nemouchi | H01L 21/28518 | 257/250 |
| 8,674,470 B1 * | 3/2014 | Or-Bach | H01L 25/0657 | 257/499 |
| 8,853,785 B2 * | 10/2014 | Augendre | H01L 21/8221 | 257/368 |
| 8,859,386 B2 * | 10/2014 | Lu | H01L 28/24 | 257/350 |
| 2001/0005059 A1 * | 6/2001 | Koyanagi | H01L 21/8221 | 257/778 |
| 2004/0012045 A1 * | 1/2004 | Lee | H01L 21/8221 | 257/306 |
| 2004/0251486 A1 * | 12/2004 | Van Brocklin | H01L 21/8221 | 257/314 |
| 2005/0045947 A1 | 3/2005 | Chen et al. | | |
| 2005/0142730 A1 * | 6/2005 | Kim | H01L 27/0688 | 438/232 |
| 2005/0176194 A1 * | 8/2005 | Sasaki | H01L 21/8221 | 438/197 |
| 2005/0221544 A1 * | 10/2005 | Kwak | H01L 27/0688 | 438/150 |
| 2006/0097319 A1 * | 5/2006 | Kim | H01L 21/28525 | 257/353 |
| 2006/0102959 A1 * | 5/2006 | Kim | H01L 21/8221 | 257/369 |
| 2006/0115944 A1 * | 6/2006 | Kwak | H01L 21/8221 | 438/199 |
| 2006/0163571 A1 * | 7/2006 | Lim | H01L 21/8221 | 257/48 |
| 2006/0183286 A1 * | 8/2006 | Lee | H01L 27/0688 | 438/270 |
| 2006/0197117 A1 * | 9/2006 | Kim | H01L 21/8221 | 257/250 |
| 2006/0234487 A1 * | 10/2006 | Kim | H01L 21/28518 | 438/597 |
| 2006/0237725 A1 * | 10/2006 | Jeong | H01L 23/485 | 257/66 |
| 2006/0237857 A1 * | 10/2006 | Bertin | B82Y 10/00 | 257/427 |
| 2006/0246710 A1 * | 11/2006 | Cheong | H01L 21/28562 | 438/618 |
| 2006/0267081 A1 * | 11/2006 | Kim | C30B 25/02 | 257/327 |
| 2006/0278985 A1 * | 12/2006 | Lim | H01L 21/28518 | 257/741 |
| 2007/0007510 A1 * | 1/2007 | Sokolik | H01L 51/0541 | 257/40 |
| 2007/0170433 A1 * | 7/2007 | Son | H01L 21/76816 | 257/67 |
| 2007/0181953 A1 * | 8/2007 | Lyu | H01L 21/8221 | 257/382 |
| 2007/0181957 A1 * | 8/2007 | Kim | H01L 27/0688 | 257/393 |
| 2007/0228478 A1 * | 10/2007 | Mikasa | H01L 21/823481 | 257/368 |
| 2007/0269941 A1 * | 11/2007 | Lee | H01L 21/26506 | 438/155 |
| 2008/0085582 A1 * | 4/2008 | Cho | H01L 27/11551 | 438/257 |
| 2008/0087932 A1 * | 4/2008 | Son | H01L 21/8221 | 257/315 |
| 2008/0185648 A1 * | 8/2008 | Jeong | H01L 21/8221 | 257/347 |
| 2008/0191312 A1 * | 8/2008 | Oh | H01L 21/2007 | 257/532 |
| 2008/0268585 A1 * | 10/2008 | Gehring | H01L 21/8221 | 438/152 |
| 2008/0272434 A1 * | 11/2008 | Park | H01L 27/115 | 257/347 |
| 2009/0020817 A1 * | 1/2009 | Park | H01L 21/8221 | 257/351 |
| 2009/0026526 A1 * | 1/2009 | Cho | H01L 21/8221 | 257/316 |
| 2009/0160012 A1 * | 6/2009 | Kim | H01L 27/0688 | 257/508 |
| 2009/0224330 A1 * | 9/2009 | Hong | G11C 11/412 | 257/368 |
| 2009/0294821 A1 * | 12/2009 | Yun | H01L 21/76224 | 257/314 |
| 2010/0035393 A1 * | 2/2010 | Aitken | H01L 21/2007 | 438/218 |
| 2010/0193871 A1 * | 8/2010 | Park | G11C 11/412 | 257/368 |
| 2011/0128777 A1 * | 6/2011 | Yamazaki | G11C 11/405 | 365/149 |
| 2011/0215787 A1 * | 9/2011 | Shionoiri | H02M 3/073 | 323/311 |
| 2011/0227074 A1 * | 9/2011 | Kato | H01L 27/0688 | 257/57 |
| 2011/0250723 A1 * | 10/2011 | Suzawa | G11C 16/0433 | 438/151 |
| 2011/0250724 A1 * | 10/2011 | Suzawa | G11C 16/0433 | 438/161 |
| 2012/0181508 A1 * | 7/2012 | Chang | H01L 21/8221 | 257/29 |
| 2012/0181510 A1 * | 7/2012 | Avouris | H01L 27/0688 | 257/29 |
| 2012/0182788 A1 * | 7/2012 | Kurokawa | H01L 21/84 | 365/149 |
| 2012/0250397 A1 * | 10/2012 | Ohmaru | G11C 11/404 | 365/149 |
| 2012/0268849 A1 * | 10/2012 | Tomatsu | H01L 27/0266 | 361/56 |
| 2012/0293202 A1 * | 11/2012 | Nishijima | H03K 19/1776 | 326/41 |
| 2013/0119349 A1 * | 5/2013 | Chung | H01L 21/8232 | 257/29 |
| 2013/0203248 A1 * | 8/2013 | Ernst | H01L 21/8221 | 438/530 |
| 2013/0258746 A1 * | 10/2013 | Kurokawa | H01L 27/0688 | 365/72 |
| 2013/0267046 A1 * | 10/2013 | Or-Bach | H01L 27/088 | 438/14 |
| 2014/0009198 A1 * | 1/2014 | Ohmaru | H01L 27/1225 | 327/198 |
| 2014/0021474 A1 * | 1/2014 | Ikeda | H01L 27/1225 | 257/57 |
| 2014/0027764 A1 * | 1/2014 | Yamazaki | H01L 27/0688 | 257/43 |
| 2014/0061805 A1 * | 3/2014 | Won | H01L 21/823412 | 257/368 |
| 2014/0061810 A1 * | 3/2014 | Sunamura | H01L 27/1225 | 257/368 |
| 2015/0021784 A1 * | 1/2015 | Lin | H01L 23/481 | 257/774 |

(56) References Cited

U.S. PATENT DOCUMENTS

| | | | | |
|---|---|---|---|---|
| 2015/0091090 A1* | 4/2015 | Okuno | ............... | G03F 9/708 257/350 |
| 2015/0249128 A1* | 9/2015 | Tamura | ............... | H01L 27/1207 257/350 |
| 2015/0311142 A1* | 10/2015 | Sekar | ............... | H01L 23/3677 257/499 |

OTHER PUBLICATIONS

Mitard et al., "1mA/um-ION Strained SiGe45%-IFQW pFETs With Raised and Embedded S/D", 2011.

Li et al., "Experimental Investigation on Superior PMOS Performance of Uniaxial Strained <110> Silicon Nanowire Channel by Embedded SiGe Source/Drain", 2007.

* cited by examiner

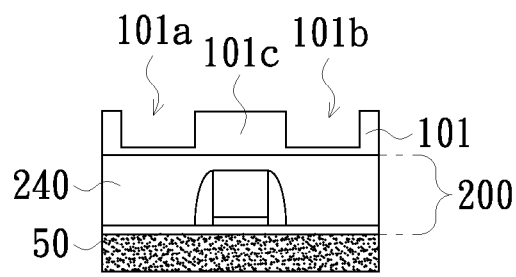
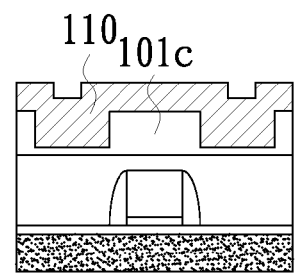
FIG. 6A  FIG. 6B
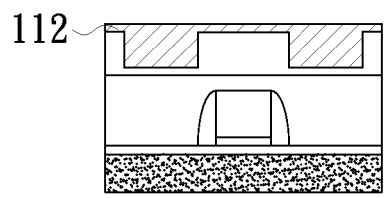
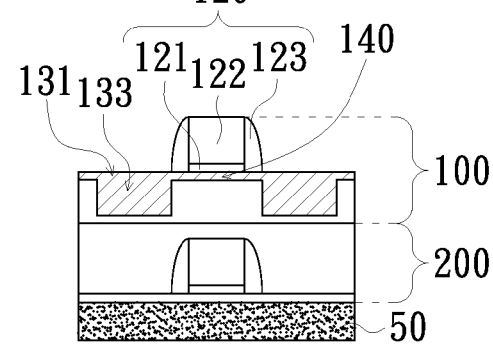
FIG. 6C  FIG. 6D

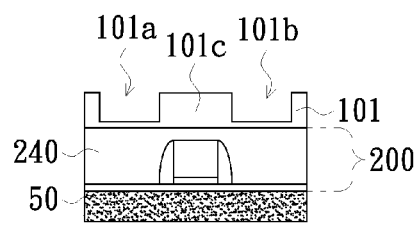
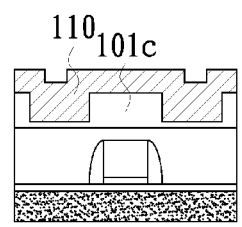
FIG. 8A   FIG. 8B
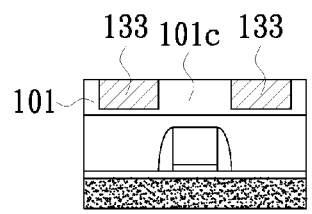
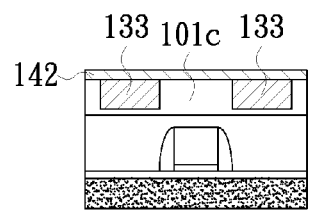
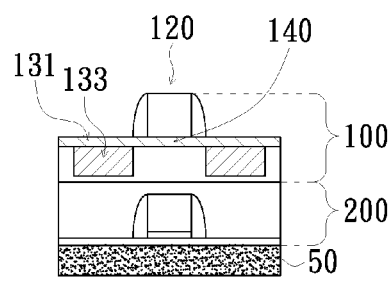
FIG. 8C   FIG. 8D   FIG. 8E

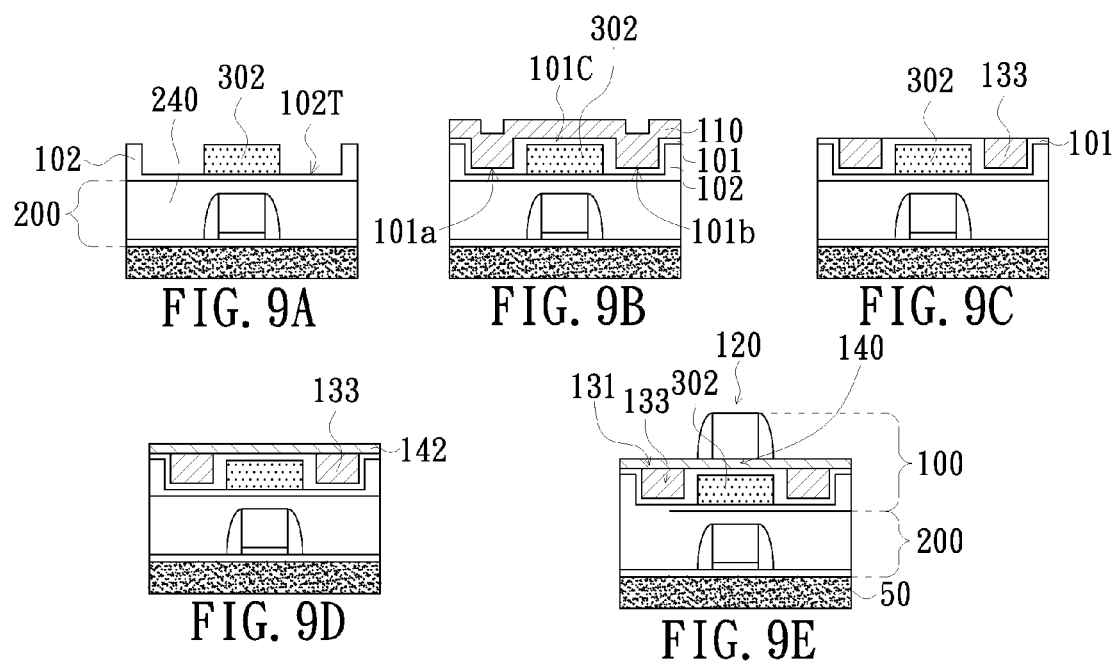

TRANSISTOR DEVICE STRUCTURE

FIELD OF THE INVENTION

The invention relates to a transistor device structure, and more particularly to a three-dimensional (3D) stackable transistor device structure.

BACKGROUND

In manufacturing thin body transistor with a thin channel, there are two issues that need to be addressed. One is dramatically increased series impedance caused by the thin channel layer. The other is over-etching issue in source/drain region during contact hole etching process.

The aforementioned two issues can be solved by introducing a raised source/drain structure or a recessed source/drain structure. However, there are limitations when applying the structures to a three-dimensional (3D) stackable device. Since the raised source/drain structure must be manufactured by a high temperature epitaxial process in greater than 800° C., the bottom transistor shall be damaged. In addition, although the recessed structure can be manufactured by low-temperature dry etching, the dry etching process tends to increase a surface roughness of the channel and interface defects caused by plasma bombardment, which deteriorates device characteristics. Therefore, the raised or recessed source/drain structure is not conducive to the development of 3D stackable device. In view of this, it is a main object of the invention to provide a high-performance 3D stackable device.

SUMMARY

A transistor device structure according to an embodiment includes a substrate, a first transistor layer and a second transistor layer. The second transistor layer is disposed between the substrate and the first transistor layer. The first transistor layer includes an insulating structure and at least a first transistor unit. The insulating structure is disposed on the second transistor layer and has a protruding portion. The first transistor unit is disposed on the insulating structure and includes a gate structure, a source/drain structure, an embedded source/drain structure and a channel. The gate structure is disposed over the protruding portion. The source/drain structure is disposed beside the gate structure and over the insulating structure. The embedded source/drain structure is disposed underneath the source/drain structure and in the insulating structure. The channel is defined between the protruding portion and the gate structure.

In an embodiment, the first transistor unit further includes a back gate structure disposed underneath the protruding portion. Besides, the back gate structure is isolated from the channel, the source/drain structure and the embedded source/drain structure.

In an embodiment, the first transistor layer further includes another insulating structure between disposed the insulating structure and the second transistor layer.

In an embodiment, the source/drain structure can be polycrystalline semiconductor material layers or single crystalline semiconductor material layers.

In an embodiment, the channel can be polycrystalline semiconductor material layers or single crystalline semiconductor material layers.

In an embodiment, the embedded source/drain structure can be polycrystalline semiconductor material layers, single crystalline semiconductor material layers or metal material layers.

In an embodiment, the source/drain structure and the embedded source/drain structure further comprise a metal semiconductor compound layer disposed therein.

In an embodiment, the gate dielectric layer has one dielectric layer or multi-stacked dielectric layers.

In an embodiment, a cross-section of the protruding portion has a polygonal or an arc contour.

In an embodiment, a via hole penetrating the first transistor layer into the second transistor layer.

In an embodiment, the transistor device structure further includes a plurality of third transistor layers disposed between the first transistor layer and the second transistor layer.

In an embodiment, the second semiconductor layer of the channel has a thickness smaller than 30 nm.

In an embodiment, the second transistor layer includes a Fin field effect transistor (FinFET), a ultra-thin body (UTB) transistor, a gate-all-around (GAA) transistor, a memory, or any combination thereof.

In an embodiment, the first transistor layer further comprises another first transistor unit, the first transistor unit and the another first transistor unit are of N-type and P-type respectively, the second transistor layer further comprises another second transistor unit, and the second transistor unit and the another transistor unit are of N-type and P-type respectively.

In an embodiment, the first transistor layer and the second transistor layer have the same structures.

Other objects, features and advantages of the invention will be further understood from the further technological features disclosed by the embodiments.

BRIEF DESCRIPTION OF THE DRAWINGS

The invention will become more readily apparent to those ordinarily skilled in the art after reviewing the following detailed description and accompanying drawings, in which:

FIGS. 6A-6D are schematic diagrams showing a flow process for manufacturing a transistor device structure according to an embodiment;

FIGS. 8A-8E are schematic diagrams showing a flow process for manufacturing a transistor device structure according to an embodiment; and FIGS. 9A-9E are schematic diagrams showing a flow process for manufacturing a transistor device structure according to an embodiment.

DETAILED DESCRIPTION OF PREFERRED EMBODIMENTS

Figure 1:
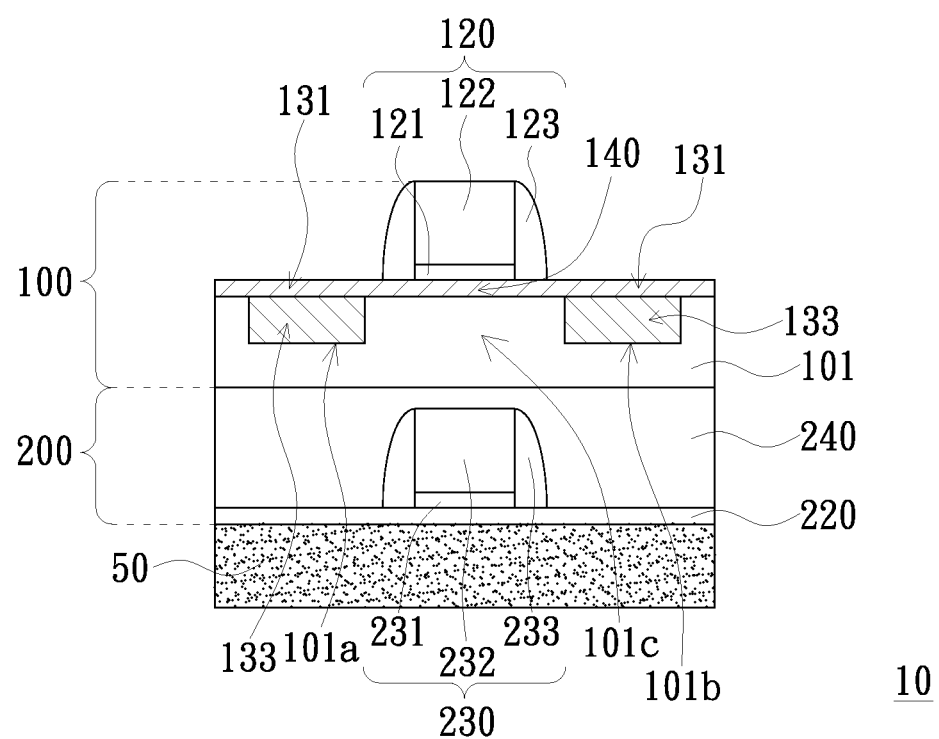
FIG. 1 is a cross-section diagram showing a transistor device structure according to an embodiment.

FIG. 1 is a cross-section diagram showing a transistor device structure 10 according to an embodiment. The transistor device structure 10 includes a substrate 50, a first transistor layer 100 and a second transistor layer 200. The second transistor layer 200 is disposed between the substrate 50 and the first transistor layer 100. The substrate 50 can be made of a semiconductor material such as silicon, or an insulating material such as glass. Also, the substrate 50 can be a flexible substrate.

In this embodiment, the first transistor layer 100 includes an insulating structure 101 and at least a first transistor unit. The insulating structure 101 is disposed over the second transistor layer 200, and has two recesses 101a and 101b, wherein the two recesses 101a, 101b define a protruding portion 101c. In other words, the protruding portion 101c of the insulating structure 101 is disposed between the two recesses 101a, 101b. The insulating structure 101 is made of, for example, silicon dioxide. It is worth to mention that a top surface of the protruding portion 101c can be a plane, which can be coplanar to or slightly lower than a sidewall of the recesses 101a, 101b that is away from the protruding portion 101c.

The first transistor unit includes a gate structure 120, two source/drain structures 131, two embedded source/drain structures 133 and a thin channel 140. The gate structure 120 can be aligned with the protruding portion 101c. The two source/drain structures 131 are separately disposed at two sides of the first gate structure 120 and over the insulating structure 101. The embedded source/drain structures 133 are disposed underneath the source/drain structure 131 and embedded in the insulating structure 101. It is to be noted that the two embedded source/drain structures are respectively disposed in the recesses 101a and 101b of the insulating structure 101. The thin channel 140 is defined between the gate structure 120 and the protruding portion 101c of the insulating structure 101. The thickness of the thin channel 140 is smaller than 30 nm. The materials of the source/drain structures 131, the embedded source/drain structures 133, and the thin channel 140 may be different or identical. The source/drain structures 131, the embedded source/drain structures 133, and the thin channel 140 may be single crystalline semiconductor material layers, polycrystalline semiconductor material layers. Besides, the embedded source/drain structures 133 may be metal material layers. The single crystalline semiconductor material layer can be IV and VI elements such as silicon (Si), germanium (Ge), silicon germanium (SiGe), molybdenum selenide ($MoSe_2$), tungsten disulfide ($WS_2$) or graphene, and can include impurities such as III and V elements. The polycrystalline semiconductor material layer can be silicon (Si), germanium (Ge), silicon germanium (SiGe) or aluminium oxide ($Al_2O_3$), and can include impurities such as III and V elements. The metal material layers can be tantalum nitride (TaN), titanium nitride (TiN), aluminum/silicon/copper alloy (AlSiCu) or other conductive material with a melting point higher than 500° C.

The gate structure 120 includes a gate dielectric layer 121, a gate electrode 122 and a spacer 123. The gate dielectric layer 121 is disposed between the thin channel 140 and the gate electrode 122, and the spacer 123 surrounds sidewalls of the gate electrode 122 and the gate dielectric layer 121. The gate dielectric layer 121 can be one dielectric layer or multi-stacked dielectric layers. The material of the dielectric layer can be $SiO_2$, $Al_2O_3$, $HfO_2$, ZrO2 or other dielectric material with dielectric constant higher than 3.5.

In one embodiment, the source/drain structure 131 and the embedded source/drain structure 133 may have a metal semiconductor compound layer formed therein for further reducing the series impedance of the transistor device structure 10. The metal semiconductor compound layer can be, for example, metal silicide or metal germanide, and can include impurities such as III or V elements.

In the embodiment of the present invention, the second transistor layer 200 stacked between the substrate 50 and the first transistor layer 100 can include a semiconductor layer 220, at least a second transistor unit 230 and an insulating material layer 240. The semiconductor layer 220 is disposed between the substrate 50 and the second transistor unit 230. The second transistor unit 230 can include a gate dielectric layer 231, a gate electrode 232 and a spacer 233. The second transistor unit 230 can be aligned with the protruding portion 101c and the gate structure 120. The insulating material layer 240 is made of, for example, silicon dioxide. The insulating material layer 240 as well as the insulating structure 101 are interlayer dielectrics of the first transistor layer 100 and the second transistor layer 200, respectively. The second transistor unit 230 can be selected from a FinFET, a UTB transistor, a GAA transistor or a memory.

In summary, the transistor device structure 10 according to an embodiment can be extensively applied to a monolithic 3D stackable transistor structure having a flat thin channel. The first transistor layer has embedded source/drain structures in order to remain device performance when the source and drain structures are over etched by via hole process. It is notable that the first transistor layer 100 can be fabricated at low-temperature manufacturing processes. Therefore, the second transistor layer 200 at the bottom will not be damaged.

Figure 2:
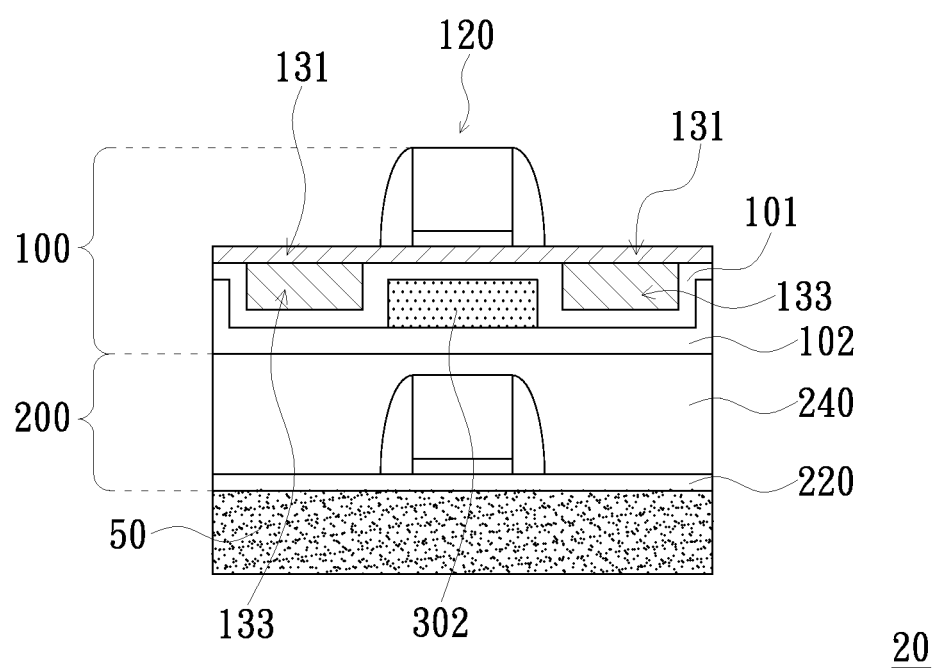
FIG. 2 is a cross-section diagram showing a transistor device structure according to an embodiment.

FIG. 2 is a cross-section diagram showing a transistor device structure 20 according to an embodiment. Since the transistor device structure 20 as shown in FIG. 2 is similar to the transistor device structure 10 shown in FIG. 1, the details will not be described hereinafter. However, in this embodiment, the transistor device structure 20 further includes a back gate structure 302 disposed in the first transistor layer 100. The insulating structure 101 can conformally cover the back gate structure 302. More specifically, the back gate structure 302 is disposed underneath the protruding portion 101c of the insulating structure 101, so that the back gate structure 302 is isolated from the channel 140 and the embedded source/drain structures 133. In addition, the first transistor layer 100 may further have an insulating structure 102 disposed between the insulating structure 101 and the insulating material layer 240. More specifically, the back gate structure 302 is enclosed by the insulating structure 101 and the insulating structure 102. The back gate structure 302 according to this embodiment is made of, for example, highly doped polysilicon, tantalum nitride (TaN), titanium nitride (TiN), aluminum/silicon/copper alloy (AlSiCu) or other conductive material with a melting point higher than 500° C.

In the transistor device structure 20 as shown in FIG. 2, the second transistor layer 200 and the first transistor layer 100 are sequentially stacked on a substrate 50. Not only the transistor layer 100 has the aforementioned benefits of the embedded source/drain structures and the thin channel, but also the electrical characteristics of the device can be modulated by the gate structure (front gate) 120 and the back gate structure 302.

Figure 3A:
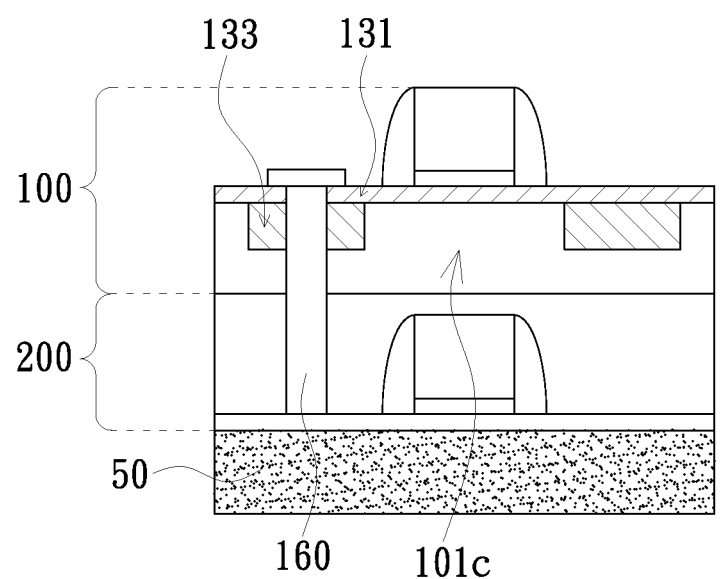
FIG. 3A is a cross-section diagram showing a transistor device structure according to an embodiment.
Figure 3B:
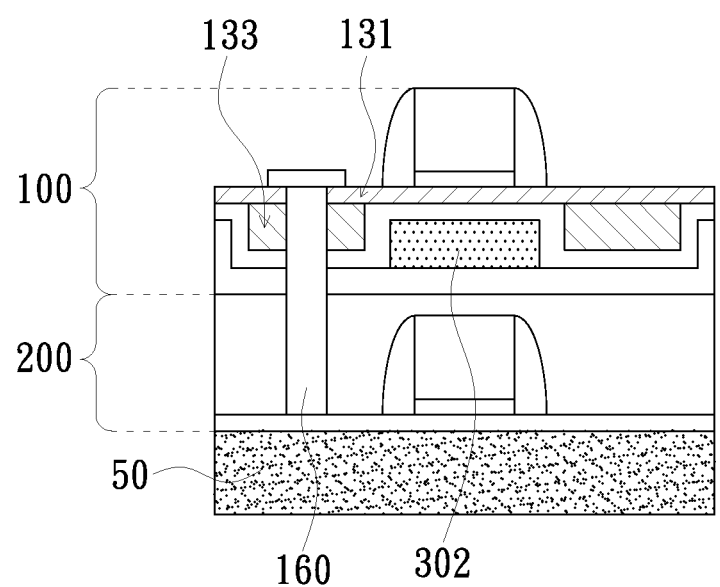
FIG. 3B is a cross-section diagram showing a transistor device structure according to an embodiment.
Figure 4A:
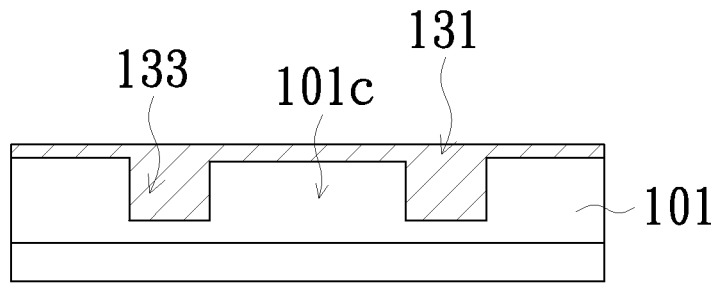
FIGS. 4A-4L are cross-section diagrams partially showing transistor device structures according to several embodiments.
Figure 4B:
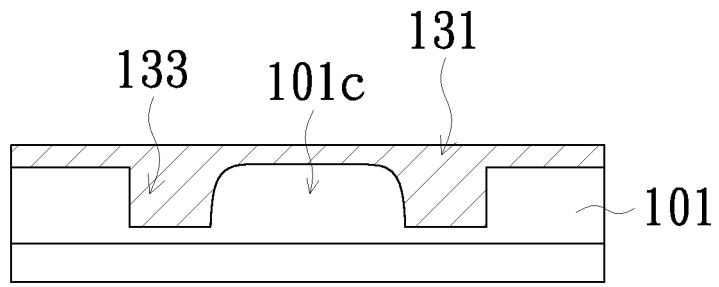
Figure 4C:
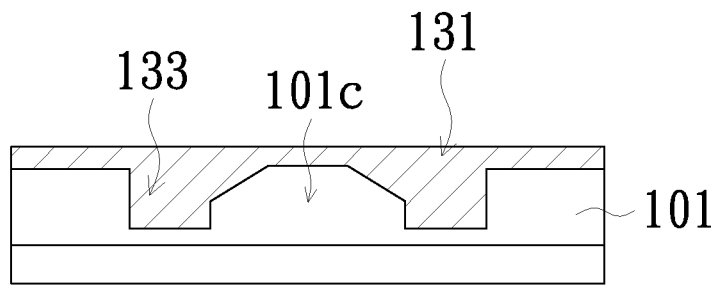
Figure 4D:
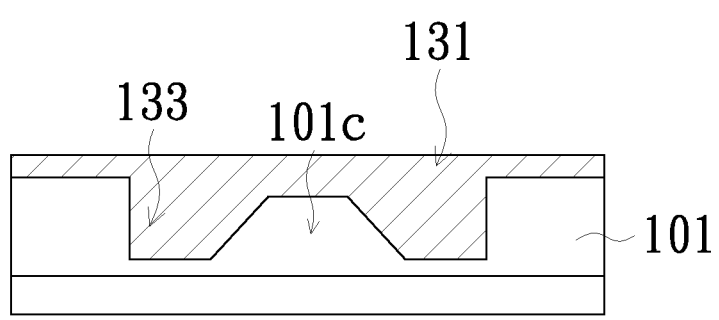
Figure 4E:
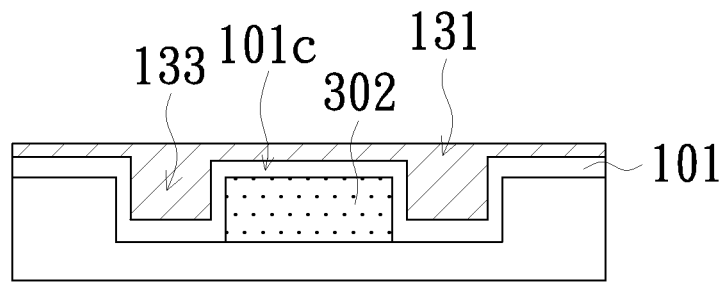
Figure 4F:
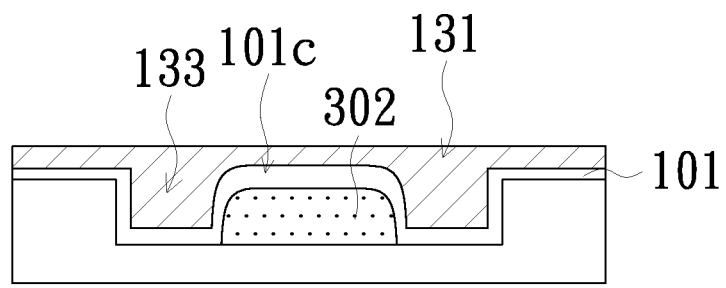
Figure 4G:
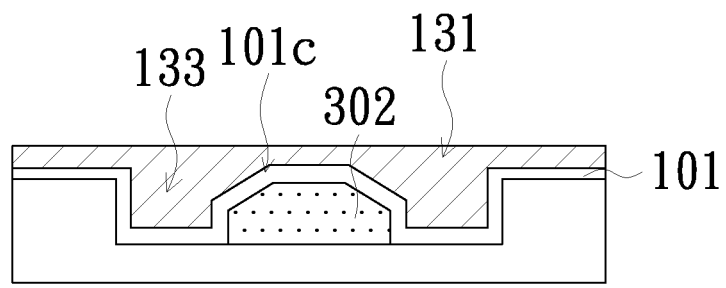
Figure 4H:
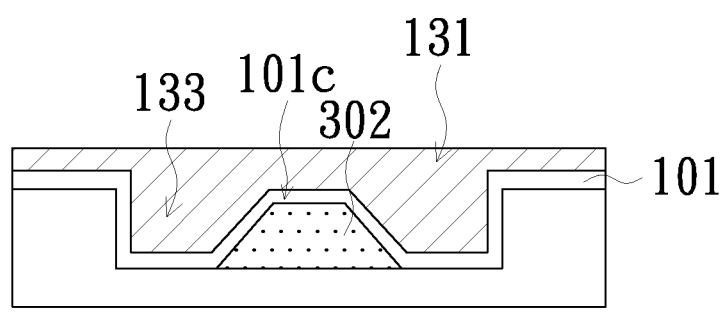
Figure 4I:
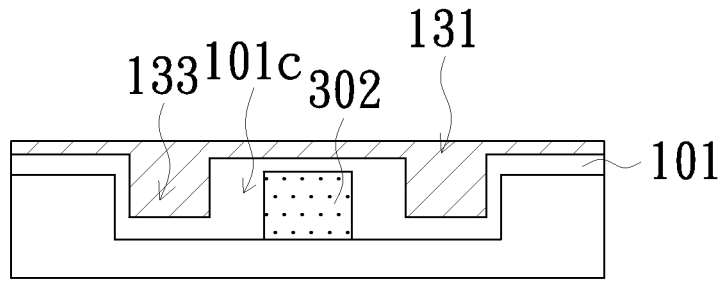
Figure 4J:
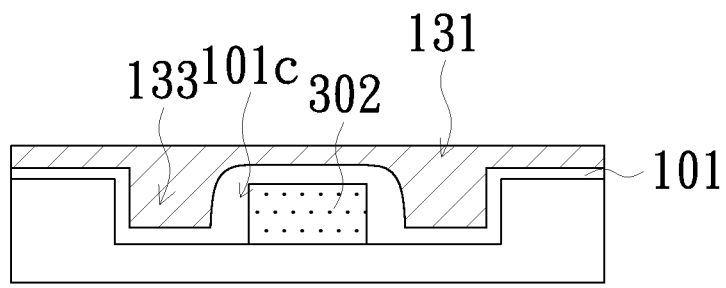
Figure 4K:
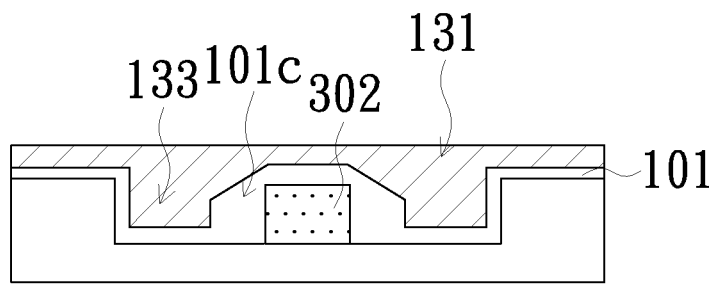
Figure 4L:
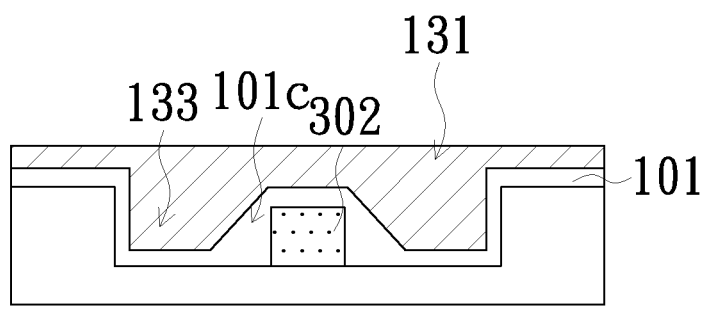

FIGS. 3A and 3B are cross-section diagrams showing a transistor device structure according to an embodiment, respectively. Since the transistor device structures as shown in FIG. 3A and FIG. 3B are respectively similar to the transistor device structure 10 shown in FIG. 1 and the transistor device structure 20 shown in FIG. 2, the details will not be described hereinafter. Please see FIG. 3A, the transistor device structure further includes a via hole 160 penetrating the first transistor layer 100 into the second transistor layer 200 in order to directly connect the first transistor layer 100 and the second transistor layer 200. Additionally, one of the benefits of the embedded source/drain structure is that the height of the via hole 160 between the first transistor layer 100 and the second transistor layer 200 can be shortened. Therefore, a lower vertical connection impedance can be obtained. Similarly, the transistor device structure having the back gate structure 302 in the first transistor layer 100, as shown in FIG. 3B, can have the via hole 160 to achieve the same benefits as described above. Thus, the vertical connection impedance can be reduced.

FIGS. 4A-4L are cross-section diagrams partially showing transistor device structures according to several embodiments. It is notable that a cross-section of the protruding portion 101c of the insulating structure 101 of the transistor device structure can have a polygonal or an arc contour. In details, the protruding portion 101c as shown in FIGS. 4A-4D can be deformations of the protruding portion 101c shown in FIG. 1. For example, a cross-section shape of the protruding portion 101c can be, but not limited to, a rectangular, an arc, a hexagonal, or a trapezoidal shape. FIGS. 4E-4L show the deformations of the protruding portion 101c shown in FIG. 2. In FIGS. 4E-4H, a cross-section of the back gate structure 302 has a polygonal or an arc contour, respectively. Since the insulating structure 101 can conformally cover the back gate structure 302, a cross-section of the protruding portion 101c similarly has a polygonal or an arc contour. In addition, the insulating structure 101 can also cover the back gate structure 302 non-conformally. For example, as shown in FIGS. 4I-4L, the distance between sidewalls of the back gate structure 302 and the embedded source region 133 or the embedded drain region 134 can be increased. By this, a leakage current caused by the back gate biasing can be reduced.

Figure 5:
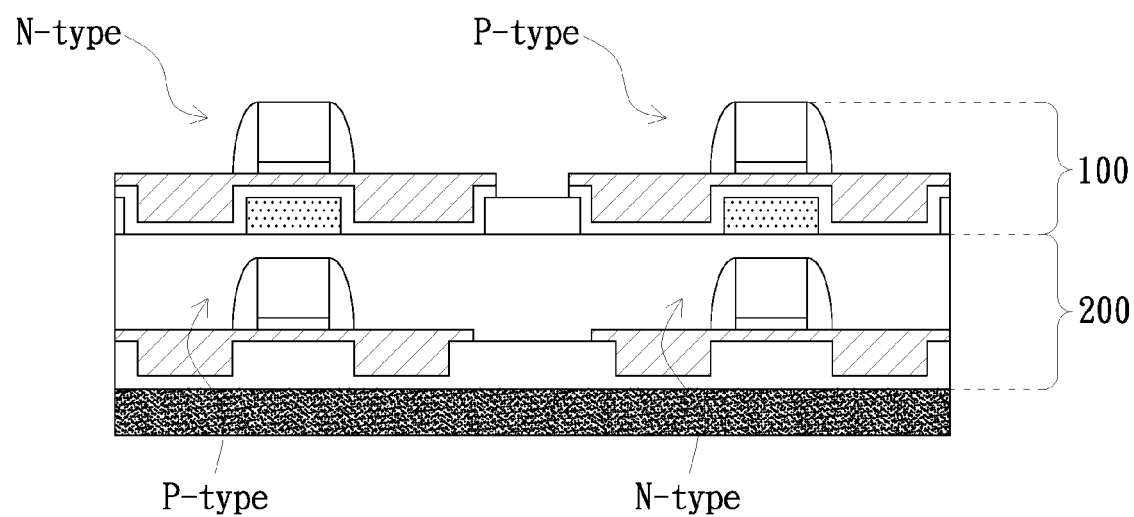
FIG. 5 is a cross-section diagram showing a transistor device structure according to an embodiment.

It is worth to mention that two or more transistor layers can be stacked in the transistor device structure depending on the demands of different industries (not shown). Also, one or more than two transistor units can be formed in each transistor layer, and any two transistor units can be of the same type or different types (P-type or N-type), or have the same structure or different structures. For example, the transistor device structure of the invention can be applied to, but not limited to, a volatile memory, a non-volatile memory, a logic circuit (such as an inverter, an NOR logic unit or an NAND logic unit) based on different combinations of transistor units. For example, FIG. 5 is a cross-section diagram showing a transistor device structure according to an embodiment. A transistor layer 200 has two transistor units of P-type and N-type, respectively. Also, a transistor layer 100 stacked on the transistor layer 200 has two transistor units, which are of N-type and P-type, respectively, and have back gate structures for modulating device characteristics. P-type and N-type transistors can be alternately disposed in a same transistor layer or in different transistor layers.

FIGS. 6A-6E are schematic diagrams showing a flow process for manufacturing a transistor device structure according to an embodiment. The transistor device structure 10 shown in FIG. 1 can be manufactured by this method. As shown in FIG. 6A, the method for manufacturing the transistor device structure according to the invention includes the following step. First, a substrate 50 is provided. Next, a transistor unit 230 as mentioned above is fabricated on the substrate 50, wherein the transistor unit 230 may at least include a gate dielectric layer 231, a gate electrode 232 and a spacer 233. Next, an insulating material layer 240 is formed on the transistor unit 230, thereby a transistor layer 200 is formed.

An insulating material layer can be formed on the insulating material layer 240. Next, an etching process is performed to the insulating material layer to form two recesses 101a and 101b, wherein the two recesses 101a and 101b define a protruding portion 101c, thereby forming the insulating structure 101 with a W-shaped cross-section.

Next, as shown in FIGS. 6A and 6B, a thicker amorphous semiconductor layer 110 is formed on the insulating structure 101 to fill the two recesses 101a and 101b and cover the protruding portion 101c of the insulating structure. The amorphous semiconductor layer 110 can be made of, for example, a semiconductor material such as amorphous silicon or amorphous germanium. For example, the amorphous semiconductor layer 110 can be formed by, but not limited to, a plasma enhanced chemical vapor deposition (PECVD) or other low-temperature deposition process.

Next, a crystallization process is performed to the amorphous semiconductor layer 110, so as to induce poly grains in the amorphous semiconductor layer. In this way, the amorphous semiconductor layer 110 can be converted to a polycrystalline semiconductor layer with a crystal grain diameter, for example, greater than 500 nm. The polycrystalline semiconductor layer with large crystal grains has characteristics closer to monocrystals. By this, the electrical performance of the device can be improved. The crystallization process can be, for example, a green pulse laser crystallization process or a thermal anneal crystallization process.

Next, as shown in FIG. 6C, a thickness reducing process is performed so as to obtain a planarized thin polycrystalline semiconductor layer 112 on the protruding portion 101c. The thickness reducing process can be, for example, chemical mechanical planarization (CMP). During the thickness reducing process, the surface roughness of the polycrystalline semiconductor layer 112 can also be ameliorated at the same time. In this way, the surface with root mean square (rms) roughness values is reduced to less than 0.5 nm, and the object for reducing the thickness of the polycrystalline semiconductor layer 112 can be achieved.

After the thickness reducing process, multi-step interfacial modification sequentially including the following steps is performed. First, the polycrystalline semiconductor layer 112 is immersed in a first mixed solution of $NH_4OH:H_2O_2:H_2O=1:4:20$ at 75° C. for 10 minutes. Next, the polycrystalline semiconductor layer 112 is immersed in a second mixed solution of $HCl:H_2O_2:H_2O=1:1:6$ at 75° C. for 10 minutes. Then, the polycrystalline semiconductor layer 112 is immersed in a pure $H_2O_2$ solution at 75° C. for 10 minutes or performed a plasma oxidation process, so as to form a sacrificial oxidation layer. Finally, the sacrificial oxidation layer is removed by a diluted solution of hydrofluoric acid. In this way, the multi-step interfacial modification is accomplished, and thus the process for manufacturing the polycrystalline semiconductor layer is completed. It is worth to mention that the surface defect density can be reduced by the multi-step interfacial modification. By this, the thickness of the polycrystalline semiconductor layer 112 nearby the protruding portion 101c can be made to be smaller than 30 nm, and the crystal grain diameter can be greater than 500 nm.

As shown in FIG. 6D, a gate structure 120 is formed on the polycrystalline semiconductor layer 112 by the following steps. First, a gate dielectric layer 121 is formed on the polycrystalline semiconductor layer 112, and then a gate electrode 122 is formed on the gate dielectric layer 121. Next, a spacer 123 is formed on sidewalls of the gate dielectric layer 121 and the gate electrode 122, thereby forming the gate structure 120. Then, the gate structure 120 may be used as a mask for performing a doping process to an exposed portion of the polycrystalline semiconductor layer 112, so as to form two source/drain structures 131, two embedded source/drain structures 133. The polycrystalline semiconductor layer 112 between the source/drain structures 131 is a channel 140. The channel 140 has a thin thickness, for example, smaller than 30 nm. Thus, a transistor layer 100 is formed.

Optionally, a further process for manufacturing a metal semiconductor compound layer is performed to form a metal layer on the device structure shown in FIG. 7D. In detail, a metal semiconductor compound layer is formed by a chemical reaction of an exposed surface of the source/drain structures 131 with a metal by utilizing the self-aligned process. By this, the monolithic 3D stackable transistor device structure according to an embodiment is completed.

Figures 7A, 7B, 7C:
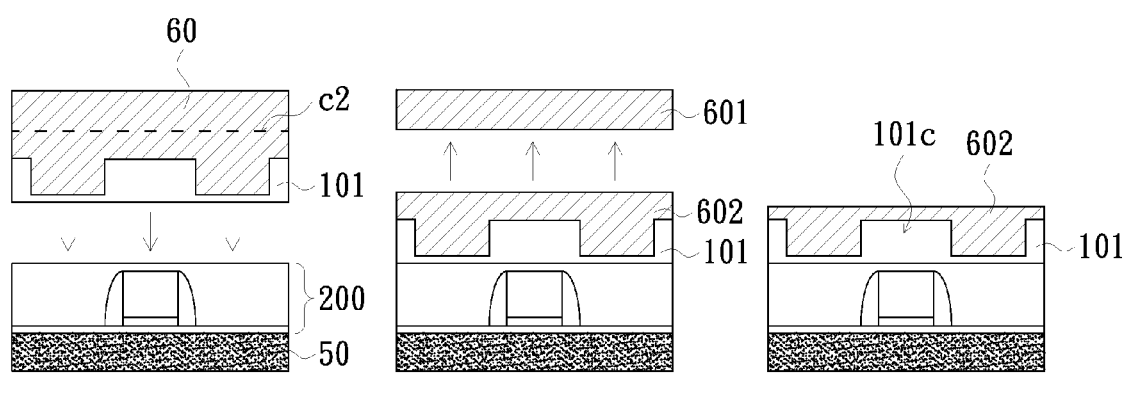
FIGS. 7A-7C are schematic diagrams showing a flow process for manufacturing a transistor device structure according to an embodiment.

FIGS. 7A-7C are schematic diagrams showing a flow process for manufacturing a transistor device structure according to an embodiment. The transistor device structure 10 shown in FIG. 1 can be manufactured by this method. The main difference between this embodiment and what shown in FIGS. 6A-6E is that a Smart Cut is used in this embodiment. That is, a semiconductor/insulating layer structure with embedded source/drain structures are bonded to another substrate with completed devices by a bonding technology.

As shown in FIG. 7A, an insulating structure 101 is formed on one side of a support substrate 60 by performing processes such as photolithography etching and filling of an insulating material to the side of the support substrate 60. Next, a gas ion implantation process using hydrogen gas with a high dose is performed to the support substrate 60 to an interface c2 as shown by a dashed line in FIG. 7A. Then, the side of the insulating structure 101 away from the support substrate 60 is bonded to the substrate 50 with a completed transistor layer 200. Next, as shown in FIG. 7B, a heating process is performed such that the ions in the interface c2 generate many microbubbles, then those microbubbles extend to a platelet form, thereby the support substrate 60 is cleaved at the interface c2 into a disposal substrate 601 and a semiconductor layer 602. Then, as shown in FIG. 7C, a thickness reducing process such as CMP can be performed to the semiconductor layer 602, such that a planarized thin channel with a thickness smaller than 30 nm can be obtained on the protruding portion 101c of the insulating structure 101. Since subsequent manufacturing processes are the same as the processes shown in FIG. 6D, the details are omitted here. It is notable that the support substrate 60 according to this embodiment can be a single crystalline semiconductor material layer. Therefore, the semiconductor layer for forming the source/drain structures 131, the embedded source/drain structures 133 and the channel 140 can all be single crystalline semiconductor material layers. By this, the transistor device structure has a better performance. As described above, Smart Cut can also be applied in a monolithic 3D stackable transistor device structure.

FIGS. 8A-8E are schematic diagrams showing a flow process for manufacturing a transistor device structure according to an embodiment. The transistor device structure 10 shown in FIG. 1 can be manufactured by this method. The main difference between this embodiment and what shown in FIGS. 6A-6E is that a thickness reducing process is performed to expose the protruding portion 101c and the embedded source/drain structures 133, as shown in FIG. 8C. Then, a semiconductor material layer 142 is formed on the exposed protruding portion 101c and the embedded source/drain structures 133, as shown in FIG. 8D. Therefore, in this embodiment of the present invention, the material of the semiconductor material layer 142 can be different from that of the embedded source/drain structures 133. As depicted in FIG. 8E, the gate structure 120 is next formed on the semiconductor material layer 142 so as to define the channel 140, thereby the transistor device structure 10 is formed. It is notable that since the source/drain structure and the channel are made of the semiconductor material layer 142, the material of the embedded source/drain structures 133 can also be different from that of the source/drain structure and the channel.

FIGS. 9A-9E are schematic diagrams showing a flow process for manufacturing a transistor device structure according to an embodiment. The transistor device structure 20 shown in FIG. 2 can be manufactured by this method. Referring to FIG. 9A, in this embodiment, after forming an insulating material layer on a transistor layer 200, the insulating material layer is etched to form an insulating structure 102 having a trench 102T. Next, a back gate structure 302 is formed on the bottom surface of the trench 102T. Then, an insulating structure 101 is formed to conformally cover the insulating structure 102 and the back gate structure 302. Also, the back gate structure 302 can be completely covered by the insulating structure 101, and two recesses 101a and 101b of the insulating structure 101 are defined at the same time. Since subsequent processes shown in FIGS. 9B-9E are the same as the processes shown in FIGS. 8B-8E, the details are omitted here. By this, a monolithic 3D stackable transistor device structure according to an embodiment is completed. Moreover, Smart Cut as shown in FIGS. 7A and 7B can also be applied in this embodiment.

In summary, the monolithic 3D stackable transistor chip according to the invention has a single crystalline or polycrystalline semiconductor thin channel, thus it does not need to use conventional high-temperature processes that damage the electrical performance of the stacked device and the metal back gate structure.

In addition, by introducing the embedded source/drain structure design to the monolithic 3D stackable transistor device structure, not only the device performance can be remained when the source/drain structures are over etched by via hole process, but also the surface evenness of the thin channel can be improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A transistor device structure, comprising a substrate, a first transistor layer and a second transistor layer, wherein the second transistor layer is disposed between the substrate and the first transistor layer, and the first transistor layer comprises:
    an insulating structure disposed over the second transistor layer and having a protruding portion; and
    at least a first transistor unit comprising:
        a gate structure disposed over the protruding portion;
        a source/drain structure disposed beside the gate structure and over the insulating structure;
        an embedded source/drain structure disposed underneath the source/drain structure and in the insulating structure; and
        a channel defined between the protruding portion and the gate structure.

2. The transistor device structure according to claim 1, wherein the first transistor unit further comprises a back gate structure disposed underneath the protruding portion, wherein the back gate structure is isolated from the channel, the source/drain structure and the embedded source/drain structure.

3. The transistor device structure according to claim 2, wherein the first transistor layer further comprises another insulating structure disposed between the insulating structure and the second transistor layer.

4. The transistor device structure according to claim 1, wherein the source/drain structure has polycrystalline semiconductor material layers or single crystalline semiconductor material layers.

5. The transistor device structure according to claim 1, wherein the channel has polycrystalline semiconductor material layers or single crystalline semiconductor material layers.

6. The transistor device structure according to claim 1, wherein the embedded source/drain structure has polycrystalline semiconductor material layers, single crystalline semiconductor material layers, or metal material layers.

7. The transistor device structure according to claim 1, wherein the source/drain structure and the embedded source/drain structure further have a metal semiconductor compound layer disposed therein.

8. The transistor device structure according to claim 1, wherein the gate structure comprises:
   a gate dielectric layer disposed on the channel;
   a gate electrode disposed on the first gate dielectric layer; and
   a spacer disposed on sidewalls of the gate dielectric layer and the gate electrode.

9. The transistor device structure according to claim 8, wherein the gate dielectric layer has one dielectric layer or multi-stacked dielectric layers.

10. The transistor device structure according to claim 1, wherein a cross-section of the protruding portion has a polygonal or an arc contour.

11. The transistor device structure according to claim 1, further comprising a via hole penetrating the first transistor layer into the second transistor layer.

12. The transistor device structure according to claim 1, further comprising a plurality of third transistor layers disposed between the first transistor layer and the second transistor layer.

13. The transistor device structure according to claim 1, wherein the channel has a thickness smaller than 30 nm.

14. The transistor device structure according to claim 1, wherein the second transistor layer comprises at least a second transistor unit selected from a FinFET, a UTB transistor, a GAA transistor or a memory.

15. The transistor device structure according to claim 14, wherein the first transistor layer further comprises another first transistor unit, the first transistor unit and the another first transistor unit are of N-type and P-type respectively, the second transistor layer further comprises another second transistor unit, and the second transistor unit and the another transistor unit are of N-type and P-type respectively.

16. The transistor device structure according to claim 1, wherein the channel is made of molybdenum selenide ($MoSe_2$), tungsten disulfide ($WS_2$) or graphene.

17. The transistor device structure according to claim 1, wherein the source/drain structure, the embedded source/drain structure and the channel have the same material layer selected from a single crystalline semiconductor material layer or a polycrystalline semiconductor layer.

18. The transistor device structure according to claim 1, wherein the first transistor layer and the second transistor layer have the same structures.

\* \* \* \* \*